(12) United States Patent
Yang

(10) Patent No.: US 11,067,266 B1
(45) Date of Patent: Jul. 20, 2021

(54) HEAT DISSIPATING LED LIGHT STRUCTURE

(71) Applicant: Nathan Yang, Surrey (CA)

(72) Inventor: Nathan Yang, Surrey (CA)

( * ) Notice: Subject to any disclaimer, the term of this patent is extended or adjusted under 35 U.S.C. 154(b) by 0 days.

(21) Appl. No.: 17/075,817

(22) Filed: Oct. 21, 2020

(51) Int. Cl.
| | |
|---|---|
| *F21V 29/10* | (2015.01) |
| *H01L 25/075* | (2006.01) |
| *H01L 33/64* | (2010.01) |
| *F21Y 115/10* | (2016.01) |
| *F21Y 103/10* | (2016.01) |

(52) U.S. Cl.
CPC .......... *F21V 29/10* (2015.01); *H01L 25/0753* (2013.01); *H01L 33/641* (2013.01); *F21Y 2103/10* (2016.08); *F21Y 2115/10* (2016.08)

(58) Field of Classification Search
CPC ... F21V 29/10; H01L 25/0753; H01L 33/641; F21Y 2103/10; F21Y 2115/10
See application file for complete search history.

(56) References Cited

U.S. PATENT DOCUMENTS

| | | | |
|---|---|---|---|
| 2019/0277487 A1* | 9/2019 | Ren | F21K 9/232 |
| 2019/0331302 A1* | 10/2019 | Cai | F21V 29/70 |

FOREIGN PATENT DOCUMENTS

| | | | | |
|---|---|---|---|---|
| CN | 203880441 U | * | 10/2014 | |
| CN | 109952470 A | * | 6/2019 | F21V 23/001 |

* cited by examiner

*Primary Examiner* — Mary Ellen Bowman
(74) *Attorney, Agent, or Firm* — Gulf Coast Intellectual Property Group

(57) ABSTRACT

A LED light that is configured to provide heat dissipation so as to allow the light to accept a higher input current so as to increase the amount of light generation. The LED light includes a body wherein the body has a wall. The wall defines the shape of the body and the body further has an interior volume. The interior volume extends between a first end and second end of the body. A LED filament is centrally disposed within the interior volume of the body and extends between the first end and second end. The interior volume is filled with a fill material wherein the fill material has a thermal conductivity that promotes heat dissipation from the body. The fill material is a transparent material so as to not interfere with the light production of the light.

4 Claims, 1 Drawing Sheet

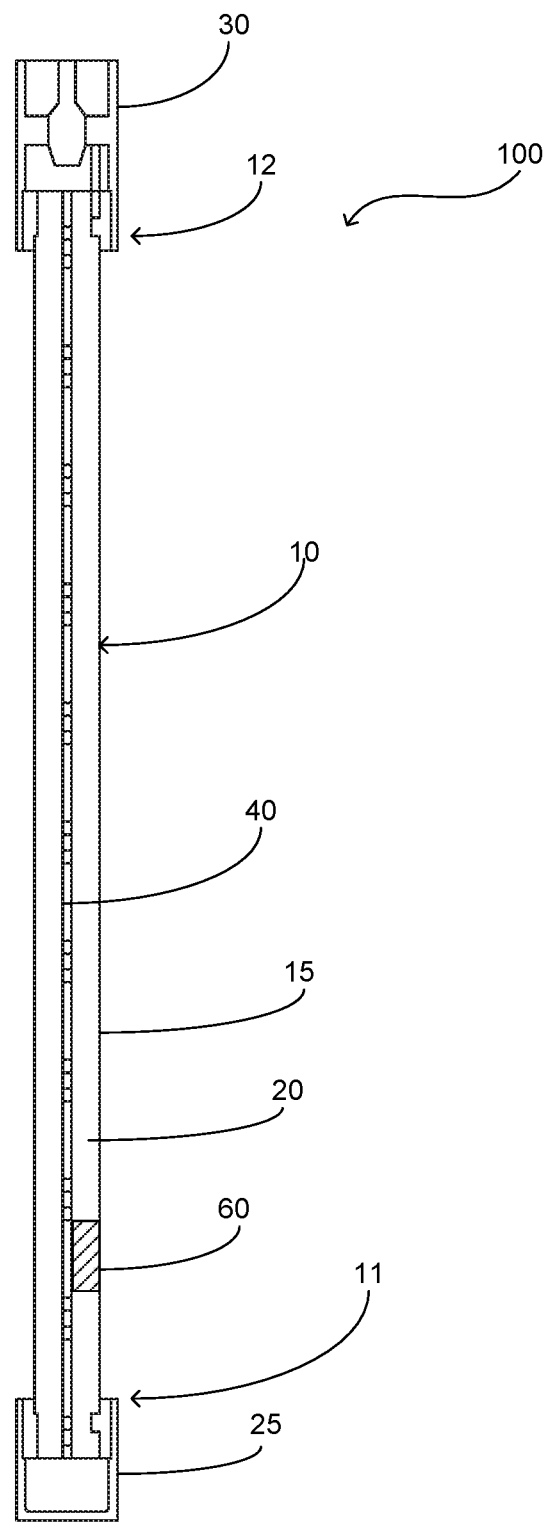

HEAT DISSIPATING LED LIGHT STRUCTURE

FIELD OF THE INVENTION

The present invention relates generally to lighting, more specifically but not by way of limitation, a LED light that is configured to allow a higher current operate the LED filament as a result of the heat dissipating capabilities of the body of the present invention.

BACKGROUND

LED lights and lighting apparatus are known in the art. The styles of LED lights are numerous and range from traditional bulb replacement styles wherein a LED light resembles the appearance of a fluorescent or incandescent bulb to alternate styles such as but not limited to ribbon and filament based LED lights. LED lights are far more desirable as the operational cost thereof is significantly less than that of traditional light bulbs.

While LED lights have certain advantages over traditional light bulbs, there are still improvements that can be made to increase the benefits and operational efficiency of the LED lights. One such area is temperature control. The temperature of a LED light is a direct result of the operating current generated by the LED driver and introduced into the light emitting diodes. The benefit of a higher current is that the LED light element can produce more light if driven by a higher current. The drawback to the higher current is the resulting increase in temperature of the LED light. As lights operate at a higher temperature their useful lifespan becomes diminished. It is preferred to dissipate the heat generated by LED lights in order to improve the operational efficiency thereof.

It is intended within the scope of the present invention to provide a LED light having a housing structure that is designed to provide heat dissipation so as to facilitate the ability to introduce more current into the light and as such increase the light production.

SUMMARY OF THE INVENTION

It is the object of the present invention to provide a LED light having a housing that is operable to provide heat dissipation wherein the housing includes a body.

Another object of the present invention is to provide a heat dissipating LED light structure wherein the body of the present invention includes a contiguous exterior wall.

A further object of the present invention is to provide a LED light having a housing that is operable to provide heat dissipation wherein the exterior wall of the housing defines an interior volume.

Still another object of the present invention is to provide a heat dissipating LED light structure wherein the body includes an interior volume.

An additional object of the present invention is to provide a LED light having a housing that is operable to provide heat dissipation wherein the interior volume extends substantially the length of the body.

Yet a further object of the present invention is to provide a heat dissipating LED light structure wherein the LED light source is centrally disposed within the interior volume of the body.

Another object of the present invention is to provide a LED light having a housing that is operable to provide heat dissipation wherein the interior volume is filled with a transparent material.

An alternate object of the present invention is to provide a heat dissipating LED light structure wherein the transparent material in the interior volume is either glass or acrylic.

An alternative objective of the present invention is to provide a LED light having a housing that is operable to provide heat dissipation so as to accept a greater input current.

Another object of the present invention is to provide a heat dissipating LED light structure that can be provided in various lengths.

To the accomplishment of the above and related objects the present invention may be embodied in the form illustrated in the accompanying drawings. Attention is called to the fact that the drawings are illustrative only. Variations are contemplated as being a part of the present invention, limited only by the scope of the claims.

BRIEF DESCRIPTION OF THE DRAWINGS

A more complete understanding of the present invention may be had by reference to the following Detailed Description and appended claims when taken in conjunction with the accompanying Drawings wherein:

FIG. 1 is a cross-sectional diagrammatic view of the present invention.

DETAILED DESCRIPTION

References now to the drawings submitted herewith, wherein various elements depicted therein are not necessarily drawn to scale and wherein through the views and figures like elements are referenced with identical reference numerals, there is illustrated a heat dissipating led light 100 constructed according to the principles of the present invention.

An embodiment of the present invention is discussed herein with reference to the figures submitted herewith. Those skilled in the art will understand that the detailed description herein with respect to these figures is for explanatory purposes and that it is contemplated within the scope of the present invention that alternative embodiments are plausible. By way of example but not by way of limitation, those having skill in the art in light of the present teachings of the present invention will recognize a plurality of alternate and suitable approaches dependent upon the needs of the particular application to implement the functionality of any given detail described herein, beyond that of the particular implementation choices in the embodiment described herein. Various modifications and embodiments are within the scope of the present invention.

It is to be further understood that the present invention is not limited to the particular methodology, materials, uses and applications described herein, as these may vary. Furthermore, it is also to be understood that the terminology used herein is used for the purpose of describing particular embodiments only, and is not intended to limit the scope of the present invention. It must be noted that as used herein and in the claims, the singular forms "a", "an" and "the" include the plural reference unless the context clearly dictates otherwise. Thus, for example, a reference to "an element" is a reference to one or more elements and includes equivalents thereof known to those skilled in the art. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

References to "one embodiment", "an embodiment", "exemplary embodiments", and the like may indicate that the embodiment(s) of the invention so described may include a particular feature, structure or characteristic, but not every embodiment necessarily includes the particular feature, structure or characteristic.

Now referring to the Drawings submitted as a part hereof, the heat dissipating led light 100 includes a body 10. The body 10 is elongated and tubular in shape and includes a first end 11 and second end 12. The body 10 is manufactured having an exterior wall 15 wherein the exterior wall is contiguously formed so as to create an interior volume 20. The interior volume 20 is configured to extend substantially between the first end 11 and second end 12. It should be understood within the scope of the present invention that the body 10 could be formed in alternate shapes and sizes wherein a wall thereof is configured to define an interior volume. While no particular material for the wall is required, a transparent material such as but not limited to glass or acrylic is desired.

The first end 11 has operably coupled thereto a first connector 25. A second connector 30 is operably coupled to the second end 12 of the body 10. The first connector 25 and second connector 30 are conventional electrical couplings that are configured to provide an operable electrical connection with a light fixture and/or power source. Those skilled in the art should recognize that the first connector 25 and second connector 30 could be manufactured from various alternate types of electrical couplings configured to electrically couple with various styles of lights.

The LED filament 40 is disposed within the interior volume 20 of the body 10 and extends the length of the body 10 intermediate the first end 11 and second end 12. The LED filament 40 is a conventional LED filament having a plurality of diodes thereon. The LED filament 40 is placed within the interior volume 20 of the body 10 such that the LED filament 40 is centrally located within the interior volume 20. Many conventional light structures have an interior volume that is an empty void and often filled with a gas. Sometimes the gas can be filled with a specialty gas such as nitrogen while others can be configured to have atmospheric air sealed and disposed therein. The deficiency of these conventional designs is the low thermal conductivity provided by air or gas. As is known in the art, thermal conductivity is measured in units of W/M/° C. Air is typically 0.024 W/M/° C. which translates into a slow rate of heat dissipation. The present invention is focused on addressing the typically poor rate of heat dissipation through having a fill material 60 disposed within the interior volume 20. The fill material 60 in a preferred embodiment is a transparent low density material so as to absorb and dissipate heat generated by the LED filament 40.

While no particular material is required, it is desirable to utilize glass or acrylic in the interior volume 20 wherein the interior volume 20 is substantially filled with the fill material 60. The thermal conductivity of the fill material 60 is such that the heat dissipation thereof is faster than that of traditional light housing construction techniques. The fill material 60 facilitates the ability for the heat dissipating led light 100 to be operated utilizing a higher current and as such have an increased light production. As the area of the fill material 60 is important, it should be understood within the scope of the present invention that the interior volume 20 is at least ninety percent occupied with fill material 60. It should be further understood that the fill material 60 is illustrated in a portion of the interior volume 20 for graphical purposes only and as stated herein occupies at least ninety percent of the interior volume 20.

In the preceding detailed description, reference has been made to the accompanying drawings that form a part hereof, and in which are shown by way of illustration specific embodiments in which the invention may be practiced. These embodiments, and certain variants thereof, have been described in sufficient detail to enable those skilled in the art to practice the invention. It is to be understood that other suitable embodiments may be utilized and that logical changes may be made without departing from the spirit or scope of the invention. The description may omit certain information known to those skilled in the art. The preceding description is, therefore, not intended to be limited to the specific forms set forth herein, but on the contrary, it is intended to cover such alternatives, modifications, and equivalents, as can be reasonably included within the spirit and scope of the invention.

What is claimed is:

1. An LED light that is configured to dissipate heat so as to accept a higher input current in order to increase light generation wherein the LED light comprises:

a body, said body having a first end and a second end, said body having a wall, said wall having an exterior surface and an interior surface, said wall defining a shape of the body, said body having an interior volume, said interior volume of said body extending between said first end and said second end of said body;

a LED filament, said LED filament being disposed in said interior volume of said body, said LED filament extending between said first end and said second end of said body, said LED filament being centrally disposed within said interior volume; and a fill material, said fill material being present in said interior volume of said body, said fill material extending between said first end and said second end of said body, said fill material being contiguous with said interior surface of said wall of said body and extending inward within the interior volume of said body so as to be adjacent the LED filament, said fill material occupying at least ninety percent of the interior volume of said body.

2. The LED light that is configured to dissipate heat as recited in claim 1, wherein the body is tubular in shape.

3. The LED light that is configured to dissipate heat as recited in claim 2, wherein said fill material is transparent and has a thermal conductivity greater than air.

4. The LED light that is configured to dissipate heat as recited in claim 3, wherein said fill material is selected from a group consisting of one of the following: glass or acrylic.

* * * * *